United States Patent

Kato et al.

[11] Patent Number: 6,040,048
[45] Date of Patent: Mar. 21, 2000

[54] ENERGY BEAM CURABLE HYDROPHILIC PRESSURE SENSITIVE ADHESIVE COMPOSITION AND USE THEREOF

[75] Inventors: Kiichiro Kato; Takeshi Kondoh, both of Urawa; Katsuhisa Taguchi, Koshigaya; Kazuhiro Takahashi, Kawaguchi, all of Japan

[73] Assignee: Lintec Corporation, Japan

[21] Appl. No.: 09/141,385

[22] Filed: Aug. 27, 1998

[30] Foreign Application Priority Data

Aug. 28, 1997 [JP] Japan .................................. 9-232238

[51] Int. Cl.⁷ ...................................... B32B 7/12
[52] U.S. Cl. ................ 428/345; 427/517; 427/208.4; 522/120; 522/121; 522/95; 428/343; 428/355 R; 428/355 AC
[58] Field of Search ................ 427/208.4, 516, 427/517; 522/121, 120, 95; 428/343, 345, 355 R

[56] References Cited

U.S. PATENT DOCUMENTS

| | | | |
|---|---|---|---|
| 4,312,916 | 1/1982 | Kakumara et al. | 428/345 |
| 5,149,586 | 9/1992 | Ishiwata et al. | 428/345 |
| 5,278,199 | 1/1994 | Ohkawa et al. | 522/95 |
| 5,281,473 | 1/1994 | Ishiwata et al. | 428/345 |
| 5,302,629 | 4/1994 | Berejka | 523/111 |
| 5,360,873 | 11/1994 | Ohkawa et al. | 525/193 |

FOREIGN PATENT DOCUMENTS

| | | |
|---|---|---|
| 0157508 | 10/1985 | European Pat. Off. . |
| 0252739 | 1/1988 | European Pat. Off. . |
| 0252739 | 10/1993 | European Pat. Off. . |
| 0745654 | 12/1996 | European Pat. Off. . |
| 60-196956 | 10/1985 | Japan . |
| 60-223139 | 11/1985 | Japan . |
| 61-043677 | 3/1986 | Japan . |
| 62-101678 | 5/1987 | Japan . |
| 05335288 | 12/1993 | Japan . |
| 0687260 | 10/1994 | Japan . |
| 06287260 | 2/1995 | Japan . |
| 08027239 | 1/1996 | Japan . |
| 8-27239 | 1/1996 | Japan . |
| 2184741 | 7/1987 | United Kingdom . |

*Primary Examiner*—James J. Seidleck
*Assistant Examiner*—Sanza L McClendon
*Attorney, Agent, or Firm*—Webb Ziesenheim Logsdon Orkin & Hanson, P.C.

[57] ABSTRACT

An energy beam curable hydrophilic pressure sensitive adhesive composition comprising a hydrophilic pressure sensitive adhesive (A) and an energy beam polymerizable compound (B), optionally together with a photopolymerization initiator (C) added according to necessity. Thus, a pressure sensitive adhesive composition suitable for use in a wafer surface protective sheet is provided, which enables easy removal of any residual pressure sensitive adhesive by washing with water, even if the pressure sensitive adhesive remains on the wafer surface after peeling of the pressure sensitive adhesive sheet.

8 Claims, No Drawings

ENERGY BEAM CURABLE HYDROPHILIC PRESSURE SENSITIVE ADHESIVE COMPOSITION AND USE THEREOF

FIELD OF THE INVENTION

The present invention relates to an energy beam curable hydrophilic pressure sensitive adhesive composition and a use thereof. More particularly, the present invention relates to a pressure sensitive adhesive composition suitable for use in a pressure sensitive adhesive sheet for protecting a wafer surface which is used for protecting circuit patterns on a wafer surface from cutting dust, and the like, during polishing of the back of the wafer.

BACKGROUND OF THE INVENTION

A circuit pattern is formed on a surface of a wafer of a semiconductor such as silicon or gallium arsenide by, for example, etching or liftoff method. Subsequently, the wafer having a circuit pattern formed thereon is subjected to polishing the back of the wafer by means of, for example, a grinder in the state that its patterned surface is generally covered with a pressure sensitive adhesive sheet. The first object of polishing the back of the patterned wafer is to remove any oxide coating which may occur on the back of the wafer at the etching step. The second object of polishing the wafer back is to regulate the thickness of the wafer having the circuit pattern formed thereon.

The polishing of the back of the wafer having the circuit pattern formed on its surface is conducted while washing the wafer back with purified water in order to remove dust raised by polishing and heat generated during the polishing. Before the polishing of the wafer back is conducted, the pressure sensitive adhesive sheet (surface protective sheet) is adhered to the wafer surface so that the circuit pattern formed on the wafer surface is protected from polishing dust and cutting water.

This type of pressure sensitive adhesive sheet is, for example:

- a hydrophilic type such as the pressure sensitive adhesive sheet of Japanese Patent Laid-open Publication No. 62(1987)-101678 using a pressure sensitive adhesive containing a nonionic surfactant or the pressure sensitive adhesive sheet of Japanese Patent Publication No. 5(1993)-77284 using a water swellable pressure sensitive adhesive, which, after the completion of the polishing, is directly peeled so that any stain on the wafer surface caused by the pressure sensitive adhesive components can easily be removed by washing with purified water; or
- an energy beam curable one such as the pressure sensitive adhesive sheet disclosed in Japanese Patent Laid-open Publication No. 8(1996)-27239, which, after the completion of back polishing, is irradiated with energy beams to thereby extremely reduce the adhesive strength to the wafer so that traces of the pressure sensitive adhesive do not remain upon peeling of the pressure sensitive adhesive sheet.

Although the above two types of pressure sensitive adhesive sheets for wafer back polishing have appropriately been employed in view of the respective characteristics and in conformity with encountered conditions, an energy beam curable pressure sensitive adhesive sheet which exhibits low peeling resistance at the time of peeling of pressure sensitive adhesive sheet and which does not break the wafer at the time of peeling be in demanded in the future due to the increased wafer diameter and reduced thickness of the wafer.

However, this energy beam curable pressure sensitive adhesive is not water washable. Thus, the problem would be encountered such that, when a residual pressure sensitive adhesive remains on a wafer surface for some reason (e.g., shortage in quantity of energy beams applied at the irradiation therewith, abnormally high temperature caused by excess irradiation, energy beam irradiation deficiency attributed to adhesion of cutting dust raised at the time of wafer back polishing onto the surface of the sheet, etc.), the residual pressure sensitive adhesive cannot be removed by water washing. Thus, when a conventional energy beam curable pressure sensitive adhesive remains on a wafer surface, it is common practice to conduct washing with an organic solvent. This, however, requires improvement from the viewpoint of, for example, environmental conservation.

The present invention provides a pressure sensitive adhesive composition suitable for use in a wafer surface protective sheet which, at the time of polishing of a wafer back, is used to protect the circuit pattern formed on the wafer surface from cutting dust, etc.

The present invention further provides a pressure sensitive adhesive composition suitable for use in a wafer surface protective sheet in which, even if a pressure sensitive adhesive remains on a wafer surface upon peeling of the pressure sensitive adhesive sheet, the residual pressure sensitive adhesive can easily be removed from the wafer surface by washing with water.

SUMMARY OF THE INVENTION

The energy beam curable hydrophilic pressure sensitive adhesive composition of the present invention comprises a hydrophilic pressure sensitive adhesive (A) and an energy beam polymerizable compound (B).

In the present invention, it is preferred that the hydrophilic pressure sensitive adhesive (A) be composed of a pressure sensitive adhesive composition formed from:

a carboxyl group containing copolymer obtained by polymerizing a carboxyl group containing a first polymerizable monomer (A1) and a second monomer (A2) that is copolymerizable with the carboxyl group containing polymerizable monomer according to solution polymerization, a neutralizer (A3), and a crosslinking agent (A4).

It is especially preferred that the second monomer (A2) that is copolymerizable with the carboxyl group containing polymerizable monomer be a compound represented by the formula:

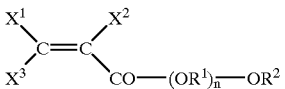

wherein each of $X^1$, $X^2$ and $X^3$ independently represents hydrogen or a methyl group; $R^1$ represents a divalent hydrocarbon group having 2 to 12 carbon atoms; $R^2$ represents a hydrocarbon group having 1 to 10 carbon atoms; and n is 1 to 10.

The energy beam polymerizable compound (B) is preferably a compound that contains at least one energy beam polymerizable carbon to carbon double bond in its molecule and has a weight average molecular weight of 100 to 50,000.

It is preferred that the energy beam curable hydrophilic pressure sensitive adhesive composition of the present invention comprise a photopolymerization initiator (C) in addition to the above components.

The pressure sensitive adhesive sheet of the present invention comprises a substrate and, superimposed thereon, a pressure sensitive adhesive layer composed of the above energy beam curable hydrophilic pressure sensitive adhesive composition. In particular, this pressure sensitive adhesive sheet is preferably used in wafer processing.

The above pressure sensitive adhesive sheet is preferably used in a method of polishing a wafer back comprising the steps of:

adhering the above pressure sensitive adhesive sheet to a patterned wafer surface, and polishing the back of the wafer while feeding water to the wafer back.

The pressure sensitive adhesive composition of the present invention possesses not only energy beam curability but also hydrophilicity. Therefore, the adhesive strength is sharply reduced by irradiation with energy beams to thereby enable easy peeling of the pressure sensitive adhesive sheet from an adherend. Further, even when the pressure sensitive adhesive remains on an adherend surface for some reason, the residual pressure sensitive adhesive can easily be removed by washing with water.

DETAILED DESCRIPTION OF THE INVENTION

The energy beam curable hydrophilic pressure sensitive adhesive composition and use thereof according to the present invention will be described in detail below.

The energy beam curable hydrophilic pressure sensitive adhesive composition of the present invention comprises a hydrophilic pressure sensitive adhesive (A) and an energy beam polymerizable compound (B). The individual components will be described below with reference to examples thereof.

Hydrophilic Pressure Sensitive Adhesive (A)

The hydrophilic pressure sensitive adhesive (A) is a pressure sensitive adhesive which is dissolved or swells upon being brought into contact with water. Various hydrophilic pressure sensitive adhesives are known, and the known hydrophilic pressure sensitive adhesives can be used in the present invention without any particular limitation. However, the below exemplified pressure sensitive adhesive compositions (1) to (4) are preferred, and, of them, the pressure sensitive adhesive composition (1) is especially preferred as the hydrophilic pressure sensitive adhesive (A) for use in the present invention.

(1) Pressure sensitive adhesive composition formed from a carboxyl group containing copolymer obtained by polymerizing a carboxyl group containing a first polymerizable monomer (A1) and a second monomer (A2) that is copolymerizable with the carboxyl group containing polymerizable monomer according to solution polymerization; a neutralizer (A3); and a crosslinking agent (A4).

The carboxyl group containing copolymer is obtained by polymerizing a carboxyl group containing the first polymerizable monomer (A1) and the second monomer (A2) that is copolymerizable with the carboxyl group containing polymerizable monomer according to solution polymerization.

The carboxyl group containing the first polymerizable monomer (A1) is a monomer which contains both a polymerizable carbon to carbon double bond and a carboxyl group. For example, acrylic acid, methacrylic acid, crotonic acid, itaconic acid, maleic acid, fumaric acid, monoalkylitaconic acid, monoalkylmaleic acid or monoalkylfumaric acid is used as the carboxyl group containing polymerizable monomer (A1). Of these, acrylic acid and methacrylic acid are preferably used in the present invention. These carboxyl groups containing polymerizable monomers can be used either individually or in combination.

Although various monomers can be used without any particular limitation as the second monomer (A2) that is copolymerizable with the above carboxyl group containing polymerizable monomer as long as they are compounds having at least one polymerizable carbon to carbon double bond, it is preferred to employ the compounds represented by the formula:

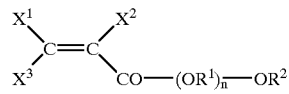

In the formula, each of $X^1$, $X^2$ and $X^3$ independently represents hydrogen or a methyl group, preferably, hydrogen.

n is 1 to 10, preferably, 1 to 4.

$R^1$ represents a divalent hydrocarbon group having 2 to 12 carbon atoms, preferably, an alkylene group having 2 to 5 carbon atoms such as ethylene, n-propylene, iso-propylene, n-butylene, iso-butylene, tert-butylene, sec-butylene or n-pentylene.

Of these, ethylene, n-propylene, n-butylene and tert-butylene are preferably used as the group $R^1$.

$R^2$ represents a hydrocarbon group having 1 to 10 carbon atoms, preferably, an alkyl group having 1 to 6 carbon atoms such as methyl, ethyl, n-propyl, iso-propyl, n-butyl, iso-butyl, tert-butyl, sec-butyl, n-pentyl, iso-pentyl, neopentyl or n-hexyl.

Of these, ethyl, n-propyl, iso-propyl, n-butyl, iso-butyl and tert-butyl are preferably used as the group $R^2$.

Accordingly, a preferred example of the monomer (A2) for use in the present invention is an alkoxy group containing (meth)acrylic acid ester such as 2-methoxyethyl (meth)acrylate, 2-ethoxyethyl (meth)acrylate, 3-methoxybutyl (meth)acrylate, 2-butoxyethyl (meth)acrylate, methoxydiethylene glycol (meth)acrylate or ethoxydiethylene glycol (meth)acrylate.

These alkoxy group containing (meth)acrylic acid esters can be used either individually or in combination.

In addition to the above alkoxy group containing (meth) acrylic acid esters, examples of the monomer (A2) include (meth)acrylic acid esters of alkyl group having 1 to 18 carbon atoms, 2-hydroxyethyl (meth)acrylate, 2-hydroxypropyl (meth)acrylate, N,N-dimethylaminoethyl (meth)acrylate, N,N-dimethylacrylamide, N,N-diethylacrylamide, N,N-dimethylaminopropylacrylamide, N,N-diethylaminopropylacrylamide, N,N-di-n-butoxymethylacrylamide, acryloylmorpholine, vinyl acetate, styrene, acrylonitrile, glycidyl (meth)acrylate, methylolacrylamide, vinylpyrrolidone, vinyl methyl ether, maleic anhydride, ethylene oxide and glycosyloxyethyl (meth)acrylate. These are preferably used in combination with the alkoxy group containing (meth)acrylic acid ester. In this instance, the ratio (weight ratio) of alkoxy group containing (meth)acrylic acid ester to other polymerizable monomer preferably ranges from about 1/20 to 99/1.

The ratio of carboxyl group containing the first polymerizable monomer (A1) to the second monomer (A2) that is copolymerizable with monomer (A1) (weight ratio of monomer (A1)/monomer (A2)) in the carboxyl group containing copolymer for use in the present invention preferably ranges from 1/500 to 1/4, and more preferably, from 1/100 to 1/10. The weight average molecular weight of the carboxyl group containing copolymer preferably ranges from 50 thousand to 1.50 million, more preferably, from 100 thousand to 1 million.

The carboxyl group containing copolymer for use in the present invention can be obtained by copolymerizing the above carboxyl group containing first polymerizable monomer (A1) and second monomer (A2) that is copolymerizable with the monomer (A1) in given proportion. This copolymerization is conducted according to a solution polymerization technique.

The solution polymerization is carried out by adding appropriate amounts of a solvent such as ethyl acetate and a polymerization initiator such as azobisisobutyronitrile to a mixture of the above first and second monomers (A1) and (A2), agitating the mixture under a stream of nitrogen at room temperature for about 30 min and performing a reaction at 40 to 100° C. for about 4 to 10 hr. As compared with emulsion polymerization, solution polymerization has advantages such that neither an emulsifier nor thickener is needed, thereby enabling a decrease in the amount of impurity ions and enabling easy control of polymerization conditions and the change of the obtained polymer composition. Moreover, a surprising effect is realized such that the polymer produced by solution polymerization is strong in shearing direction action as compared with the polymer produced by emulsion polymerization.

The above carboxyl group containing copolymers can be used either individually or in combination.

The neutralizer (A3) is used to neutralize part or all of the carboxyl groups of the above carboxyl group containing copolymer so as to impart hydrophilicity or water solubility to the carboxyl group containing copolymer. Taking into account ionic impurities which are detrimental to the wafer, it is preferred that a compound not containing any of metals and halogens in its molecule be used as the neutralizer (A3). Although various basic compounds can be employed, unsubstituted or substituted amines are preferably used in the present invention. Of them, water soluble amine compounds are especially preferred.

Examples of the above amine compounds include ammonia, ammonium salts exhibiting alkalinity and organic amino compounds exhibiting alkalinity, primary amines such as monoethylamine and monoethanolamine; secondary amines such as diethylamine and diethanolamine; tertiary amines such as triethylamine, triethanolamine, N,N-dimethylformamide diethylacetal, N,N,N'-trimethylethylenediamine, N-methyldiethanolamine and N,N-diethylhydroxylamine; amino compounds having a plurality of Ns in the molecule, such as diamine and polyethyleneimine; and cyclic amino compounds such as pyridine.

Triethanolamine and N,N-dimethylformamide diethylacetal are preferably used in the present invention.

The above neutralizers can be used either individually or in combination.

The neutralizer (A3) is preferably used in an amount of 0.0001 to 1 mol, more preferably, 0.01 to 0.5 mol per mol of carboxyl group of the above carboxyl group containing copolymer is used.

The crosslinking agent (A4) is used to partially crosslink the above carboxyl group containing copolymer. As the crosslinking agent (A4), use can be made of, for example, compounds having a glycidyl group in the molecule, e.g., epoxy crosslinking agents such as neopentyl glycol diglycidyl ether, polyethylene glycol diglycidyl ether, bisphenol A diglycidyl ether, bisphenol F diglycidyl ether, diglycidyl phthalate, dimer acid diglycidyl ether, triglycidyl isocyanurate, diglycerol triglycidyl ether, sorbitol tetraglycidyl ether, N,N,N',N'-tetraglycidyl-m-xylenediamine, 1,3-bis(N,N-diglycidylaminomethyl)cyclohexane and N,N,N', N'-tetraglycidyldiaminodiphenylmethane; compounds having an isocyanate group in the molecule, e.g., isocyanate crosslinking agents such as tolylene diisocyanate and diphenylmethane diisocyanate; methylol crosslinking agents such as melamine and phenol; chelating crosslinking agents; and aziridine crosslinking agents.

Effecting a partial crosslinking of the carboxyl group containing copolymer with the crosslinking agent (A4) enables regulating the peeling strength of the obtained pressure sensitive adhesive to an appropriate value and enables producing a pressure sensitive adhesive which swells in water without being dissolved therein.

The crosslinking agent (A4) is preferably used in an amount of 0.001 to 1.0 mol, more preferably, 0.01 to 0.75 mol per mol of carboxyl group of the above carboxyl group containing copolymer is used.

The pressure sensitive adhesive composition (1) for use in the present invention comprises the carboxyl group containing copolymer and the above components (A3) and (A4) as principal components and can be obtained by appropriately mixing these components together. Preferably, the carboxyl group containing copolymer is first mixed with the neutralizer (A3) and, thereafter, the crosslinking agent (A4) is added to the mixture to thereby crosslink the carboxyl group containing copolymer.

The mixing of the carboxyl group containing copolymer with the neutralizer (A3) is conducted, for example, by adding the neutralizer (A3) directly or after dilution with a solvent (e.g., alcohol or acetone) to the carboxyl group containing copolymer at room temperature and, thereafter, agitating the mixture at 5 to 40° C. for at least 25 min.

Further, the crosslinking agent (A4) is added directly or after dilution with a solvent (e.g., toluene, ethyl acetate or isopropyl alcohol) to the above obtained mixture at room temperature and agitated at 5 to 40° C. for at least 5 min, thereby obtaining the pressure sensitive adhesive composition (1) of the present invention.

The thus obtained pressure sensitive adhesive composition (1) is a pressure sensitive adhesive composition which is of the solvent type and soluble in water (swellable in water) without the use of any trace of surfactant. This pressure sensitive adhesive composition has excellent water washability and exhibits an extremely small value of peeling electrification voltage at the time of peeling of the pressure sensitive adhesive sheet because hydrophilicity is imparted to the pressure sensitive adhesive polymer per se. Moreover, water solubility (water swellability) is imparted to the pressure sensitive adhesive composition (1) without conducting a polymer blend of water soluble polymer and (meth)acrylic polymer, so that the amount of glue residue which may occur at the time of peeling of the pressure sensitive adhesive sheet is extremely small.

In place of the above pressure sensitive adhesive composition (1), the following pressure sensitive adhesive compositions can be used as the hydrophilic pressure sensitive adhesive (A) in the present invention.

(2) Hydrophilic pressure sensitive adhesive composition comprising a pressure sensitive adhesive and a surfactant.

The pressure sensitive adhesive is not particularly limited, and use can be made of, for example, known pressure sensitive adhesives containing, as a base polymer, natural rubber, polyisobutylene, polyisoprene, a synthetic resin or synthetic rubber whose principal component is a compound such as an acrylic ester, or the like.

Polyolefin glycol surfactants are preferably used as the surfactant. Examples thereof include polyethylene glycol alkylphenyl ethers, polyethylene glycol alkyl ethers, polyethylene glycol fatty acid esters and polypropylene glycol polyethylene glycol ether. Those whose HLB value ranges from 8 to 18 are preferably used. The above polyolefin glycol surfactants may be used either individually or in combination.

It is desirable to add the polyolefin glycol surfactant in an amount of about 0.1 to 10 parts by weight, especially, 0.5 to 8 parts by weight per 100 parts by weight of pressure sensitive adhesive.

The details of examples of the above pressure sensitive adhesive composition (2) are described in, for example, Japanese Patent Laid-open Publication No. 62(1987)-101678.

(3) Emulsion type pressure sensitive adhesive.

The terminology "emulsion type pressure sensitive adhesive" used herein means a pressure sensitive adhesive obtained by adding an emulsifier, a deionized water and a polymerization initiator to a (meth)acrylic ester monomer such as methyl methacrylate, butyl acrylate or 2-ethylhexyl acrylate and performing an emulsion polymerization in water. A suitable monomer composition can be selected in conformity with a required adhesive strength. The emulsion type pressure sensitive adhesive thus obtained by polymerization generally has a solid content of 20 to 60% by weight.

According to necessity, a water soluble organic compound and/or a nonionic surfactant can be added to the above emulsion type pressure sensitive adhesive.

Examples of suitable water soluble organic compounds include diethylene glycol monobutyl ether, triethylene glycol monomethyl ether, ethylene glycol monomethyl ether and diethylene glycol monobutyl ether acetate. Of these, water soluble organic compounds having a boiling point of 100° C. or higher, especially, 150° C. or higher are preferred.

Examples of suitable nonionic surfactants include polyoxyethylene octylphenol ether, alkanolamides, polyoxyethylene nonylphenol ether, polyethylene glycol and polyethyleneoxylauryl ether.

When the water soluble organic compound is used, it is preferably added in an amount of 1 to 100 parts by weight, more preferably, 5 to 50 parts by weight per 100 parts by weight of emulsion type pressure sensitive adhesive is employed.

When the nonionic surfactant is used, it is preferably added in an amount of 0.01 to 50 parts by weight, more preferably, 0.1 to 10 parts by weight per 100 parts by weight of emulsion type pressure sensitive adhesive is used.

The details of examples of the above pressure sensitive adhesive composition (3) are described in, for example, Japanese Patent Publication No. 1(1989)-51511.

(4) Hydrophilic pressure sensitive adhesive composition comprising a pressure sensitive adhesive and a water soluble polymer.

An acrylic pressure sensitive adhesive or a rubber pressure sensitive adhesive can suitably be used as the pressure sensitive adhesive. A crosslinkable acrylic pressure sensitive adhesive is especially preferred.

Although various polymers can be used as the water soluble polymer, those capable of exerting surfactant functions and plasticizer functions, such as polypropylene glycol, are preferred. Diol or triol type polypropylene glycol is especially preferred.

The water soluble polymer is preferably added in an amount of about 0.1 to 50 parts by weight, more preferably, 1 to 20 parts by weight per 100 parts by weight of pressure sensitive adhesive is added.

The details of examples of the above pressure sensitive adhesive composition (4) are described in, for example, Japanese Patent Laid-open Publication No. 5(1993)-335288.

Energy Beam Polymerizable Compound (B)

The energy beam polymerizable compound (B) for use in the present invention is a compound having at least one energy beam polymerizable carbon to carbon double bond in its molecule, which compound preferably has a weight average molecular weight of 100 to 50,000, more preferably, 500 to 30,000 and, optimally, 1000 to 20,000 and can be polymerized by irradiation with energy beams.

For example, energy beam polymerizable compounds disclosed in Japanese Patent Laid-open Publication No. 60(1985)-196,956 and Japanese Patent Laid-open Publication No. 60(1985)-223,139 are widely used as the above energy beam polymerizable compound (B). Examples of energy beam polymerizable compounds (B) include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate and commercially available oligoester acrylates.

In addition to the above acrylate compounds, urethane acrylate oligomers can be used as the energy beam polymerizable compound. Urethane acrylate oligomers can be obtained by reacting a polyester or polyether type polyol compound with a polyisocyanate compound such as 2,4-tolylene diisocyanate, 2,6-tolylene diisocyanate, 1,3-xylylene diisocyanate, 1,4-xylylene diisocyanate or diphenylmethane-4,4'-diisocyanate to thereby obtain an isocyanate-terminal urethane prepolymer and by reacting this isocyanate-terminal urethane prepolymer with a hydroxyl group containing acrylate or methacrylate such as 2-hydroxyethyl acrylate, 2-hydroxyethyl methacrylate, 2-hydroxypropyl acrylate, 2-hydroxypropylmethacrylate, polyethylene glycol acrylate or polyethylene glycol methacrylate.

Of these urethane acrylates, a hydrophilic urethane acrylate compound is preferably used in the present invention. For example, preferred use is made of a product of reaction of a (meth)acrylic acid ester containing at least one hydroxyl group in its molecule, an organic polyisocyanate and a polyethylene glycol monoalkyl ether having one hydroxyl group.

The above polyethylene glycol monoalkyl ether is a compound represented by the formula:

wherein R represents a lower alkyl group, and n is an integer of 3 to 40.

The details of these preferred urethane acrylate compounds are described in, for example, Japanese Patent Laid-open Publication No. 6(1994)-287260.

In the pressure sensitive adhesive composition of the present invention, the energy beam polymerizable compound (B) is preferably used in an amount of 10 to 200 parts by weight, still preferably, 50 to 150 parts by weight and, optimally, 70 to 120 parts by weight per 100 parts by weight of hydrophilic pressure sensitive adhesive (A). In these amounts, the initial adhesive strength of the thus obtained pressure sensitive adhesive is large, and the adhesive strength is sharply decreased upon irradiation with energy beams to thereby facilitate peeling from an adherend and to avoid leaving a residue pressure sensitive adhesive on the surface of the adherend.

When the amount of energy beam polymerizable compound (B) is less than 10 parts by weight, the decrease of the adhesive strength upon irradiation with energy beams is not satisfactory. On the other hand, when the amount exceeds 200 parts by weight, there is the unfavorable possibility that the removal of the pressure sensitive adhesive with water becomes difficult.

Photopolymerization Initiator (C)

When curing is conducted by irradiation with light, the energy beam curable hydrophilic pressure sensitive adhesive composition of the present invention can be doped with a photopolymerization initiator (C). The period of polymerization/curing by irradiation with light and the light dosage can be reduced by the doping with the photopolymerization initiator (C).

Examples of suitable photopolymerization initiators (C) include 1-hydroxycyclohexyl phenyl ketone, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl and β-chloroanthraquinone.

It is preferred that the photopolymerization initiator (C) be used in an amount ranging from 0.05 to 15 parts by weight, especially, from 0.1 to 10 parts by weight and, more preferably, from 0.5 to 5 parts by weight per 100 parts by weight of energy beam polymerizable compound (B) is used.

Other Components

For the purpose of regulating the adhesive strength, cohesive strength, tack, molecular weight, molecular weight distribution, elasticity, glass transition temperature, hydrophilicity, water resistance, etc. of the pressure sensitive adhesive, the energy beam curable hydrophilic pressure sensitive adhesive composition of the present invention can be doped with a hydrophilic plasticizer such as a water soluble polyhydric alcohol, a tackifier resin, a pigment, a dye, an antifoaming agent, an antiseptic, etc. according to necessity, in an amount not detrimental to the object of the present invention. These other components are preferably added in an amount of about 0.01 to 20 parts by weight per 100 parts by weight of component (A), although the actual amount is dependent on the particular purpose for which the additional individual component is added.

Energy Beam Curable Hydrophilic Pressure Sensitive Adhesive Composition

The energy beam curable hydrophilic pressure sensitive adhesive composition of the present invention is obtained by blending together the above hydrophilic pressure sensitive adhesive (A) and energy beam polymerizable compound (B), optionally together with the above photopolymerization initiator (C) and other components, by the customary method.

This energy beam curable hydrophilic pressure sensitive adhesive composition is cured by irradiation with energy beams so that the amount of pressure sensitive adhesive remaining on an adherend after peeling is reduced to an extreme degree.

For example, ultraviolet rays and electron beams are used as the energy beams. The energy beam dosage is varied depending on the formulation of the pressure sensitive adhesive and upon the type of energy beams employed. For example, when use is made of ultraviolet rays, the dosage thereof preferably ranges from about 40 to 200 W/cm. When use is made of electron beams, the dosage thereof is preferred to range from about 10 to 1000 krad. This energy beam irradiation causes a marked reduction in the adhesive strength of the composition of the present invention. For example, whereas the adhesive strength to a mirror surface of a semiconductor wafer ranges from about 100 to 1000 g/25 mm before the energy beam irradiation, control can be effected so that the adhesive strength after the energy beam irradiation is about 0.5 to 50% of that before the energy beam irradiation.

Moreover, the pressure sensitive adhesive composition of the present invention, even after having been cured by energy beams, maintains hydrophilicity due to the presence of the hydrophilic pressure sensitive adhesive (A).

For example, when the above pressure sensitive adhesive composition (1) is used as the hydrophilic pressure sensitive adhesive (A), the hydrophilic pressure sensitive adhesive polymer finitely swells in a crosslinked state. The pressure sensitive adhesive polymer swells even after irradiation with energy beams, so that, even if the pressure sensitive adhesive remains on the wafer surface, washing can be performed. When use is made of the pressure sensitive adhesive compositions (2) to (4), water penetrates in the interface of the pressure sensitive adhesive and the wafer by the actions of the surfactant and water soluble polymer.

The hydrophilicity of the pressure sensitive adhesive is evaluated as follows. That is, only the pressure sensitive adhesive is stuck to an adherend (mirror wafer) and dipped in 23° C. water. The time required for the pressure sensitive adhesive to be dissolved or swell in water to thereby be completely removed from the adherend is measured.

There is generally a step of washing a polished wafer with water, for example, in order to remove polishing dust therefrom.

From the viewpoint of step adaptability, it is preferred that the pressure sensitive adhesive composition of the present invention be removed from the adherend within 30 min, especially, within 10 min. When more than 30 min is taken, productivity may be unfavorably lowered.

As apparent from the above, the pressure sensitive adhesive composition of the present invention possesses hydrophilicity even after having been cured by energy beams, so that, even if the pressure sensitive adhesive remains on the adherend surface after the curing, residual pressure sensitive adhesive can be removed by simple water washing.

Pressure Sensitive Adhesive Sheet

The pressure sensitive adhesive sheet of the present invention comprises a substrate and, superimposed thereon, a pressure sensitive adhesive layer composed of the above pressure sensitive adhesive composition.

Although the above substrate is not particularly limited, it may be selected from among, for example, films of polyethylene, polypropylene, polybutene, polybutadiene, polymethylpentene, polyvinyl chloride, vinyl chloride copolymer, polyethylene terephthalate, polybutylene terephthalate, polyurethane, ethylene/vinyl acetate copolymer, ionomer resin, ethylene/(meth)acrylic acid copolymer, ethylene/(meth)acrylic acid ester copolymer, polystyrene and polycarbonate, films produced by crosslinking these and films composed of laminates thereof. Furthermore, according to necessity, use can be made of films produced by coloring the above films, fluororesin films and the like. The thickness of the substrate generally ranges from about 50 to 500 µm, preferably, from about 80 to 300 µm. When the thickness of the substrate is smaller than these, there is the danger that the surface protecting capability of the pressure sensitive adhesive sheet is deteriorated.

The pressure sensitive adhesive sheet of the present invention can be obtained by coating a variable substrate in appropriate thickness with the above pressure sensitive adhesive composition according to the customary technique employing a comma coater, gravure coater, die coater, reverse coater or the like and drying the composition to thereby form a pressure sensitive adhesive layer on the substrate. When considered necessary, a release sheet is applied onto the pressure sensitive adhesive layer.

Although varied depending on the use, the thickness of the pressure sensitive adhesive layer generally ranges from about 10 to 50 µm, preferably, from about 20 to 40 µm. When the thickness of the pressure sensitive adhesive layer is smaller than these, there is the danger that the surface protecting capability of the pressure sensitive adhesive sheet is deteriorated.

The configuration of the pressure sensitive adhesive sheet of the present invention is not limited and the pressure sensitive adhesive sheet may have the form of, for example, a tape or a label.

The above pressure sensitive adhesive sheet of the present invention can suitably be used for protecting the surface of a wafer, or other objects.

That is, the pressure sensitive adhesive sheet comprising the above constituents prevents the penetration of polishing dust, cutting dust, and the like into the interface between the pressure sensitive adhesive layer and the adherend surface during the step of wafer processing to thereby provide satisfactory protection to the wafer surface. Moreover, not only can the pressure sensitive adhesive sheet be easily peeled from the wafer after the completion of required processing but also, even if the pressure sensitive adhesive sticks to and remains on the wafer surface, the residual pressure sensitive adhesive can easily be washed away with water.

Method of Use

The above pressure sensitive adhesive sheet of the present invention can suitably be used as a surface protective sheet, especially during wafer processing.

A method of polishing a wafer back with the use of the pressure sensitive adhesive sheet of the present invention is described below.

When a release sheet is disposed on an upper surface of the pressure sensitive adhesive sheet, the release sheet is removed. Subsequently, a wafer whose back is to be polished is adhered to the pressure sensitive adhesive layer of the pressure sensitive adhesive sheet. This adhering step is conducted such that a patterned surface of the wafer contacts the pressure sensitive adhesive layer.

In this form, the wafer back is polished by means of a grinder or the like to thereby not only remove any oxide layer on the wafer back but also to regulate the thickness of the wafer to desired one. During this step, purified water is sprayed to the wafer so that polishing dust is washed away from the wafer and to absorb heat generated during the polishing.

Upon completion of the polishing step, the pressure sensitive adhesive sheet is peeled from the wafer. In the pressure sensitive adhesive sheet of the present invention, as apparent from the foregoing, the adhesive strength can be reduced to an extremely low level by irradiating with an energy beam, so that the pressure sensitive adhesive sheet can easily be peeled from the wafer surface. Furthermore, even if the pressure sensitive adhesive remains on the wafer surface after the peeling of the pressure sensitive adhesive sheet, the residual pressure sensitive adhesive can easily be washed away from the water with purified water.

In summary, the pressure sensitive adhesive layer of the pressure sensitive adhesive sheet of the present invention is composed of a pressure sensitive adhesive composition containing specific components, so that the adhesive strength thereof is extremely reduced by irradiation with energy beams to thereby enable easy peeling from the water. Moreover, even if the pressure sensitive adhesive remains on the wafer surface, the residual pressure sensitive adhesive can easily be washed away with purified water without the need to use an organic solvent such as trichlene. Therefore, there is no danger to human health or a threat of environmental pollution. The prior art has required two steps of washing the wafer surface having the pressure sensitive adhesive adhering thereto first with an organic solvent such as trichlene and, thereafter, washing with water. To the contrary, only one step is required in the present invention, namely, washing of the wafer surface with purified water, for example, in an ultrasonic washer is satisfactory to remove the pressure sensitive adhesive. Furthermore, the pressure sensitive adhesive sheet of the present invention possesses satisfactory adhesive strength with the wafer during the polishing of the wafer back, so that penetration of wafer polishing dust into the interface between the wafer surface and the pressure sensitive adhesive sheet to thereby break the pattern formed on the wafer surface is avoided.

EFFECT OF THE INVENTION

The pressure sensitive adhesive composition of the present invention possesses both energy beam curability and hydrophilicity. Therefore, the adhesive strength is extremely reduced by irradiation with energy beams to thereby enable easy peeling of the pressure sensitive adhesive sheet from the adherend. Further, even if the pressure sensitive adhesive remains on the adherend surface for some reason, the residual pressure sensitive adhesive can easily be removed by washing with water.

EXAMPLE

The present invention is further illustrated below with reference to the following Examples which in no way limit the scope of the invention.

In the following Examples and Comparative Examples, the "residual particles", "water washability" and "adhesive strength" were evaluated in the following manner.

Measurement of Residual Particles

The pressure sensitive adhesive sheet obtained in each of the following Examples and Comparative Examples was applied to the mirror surface of a 4-inch silicon wafer in 23° C./65% RH atmosphere by reciprocating a 2 kg rubber roller thereon, and allowed to stand still for 20 min. From the substrate film side, the pressure sensitive adhesive sheet was irradiated at a line speed of 5 m/min with ultraviolet rays emitted from a high pressure mercury lamp (80 W/cm) disposed at a distance of 10 cm from the pressure sensitive adhesive sheet. Thereafter, the pressure sensitive adhesive sheet was peeled. The number of residual particles with a particle size of at least 0.27 μm (diameter) remaining on the wafer surface was measured by the use of a laser surface inspecting instrument (LS 5000 manufactured by Hitachi Electronic Engineering Co., Ltd.).

Water Washability

The pressure sensitive adhesive only produced in each of the following Examples and Comparative Examples was applied and dried to obtain a coating with a thickness of 50 μm, and the resultant sheet was cut into 20 mm squares, applied to a mirror wafer and allowed to stand still for 20 min. The pressure sensitive adhesive layer was irradiated at a line speed of 5 m/min with ultraviolet rays emitted from a high pressure mercury lamp (80 W/cm) disposed at a distance of 10 cm from the layer. Thereafter, the wafer with pressure sensitive adhesive coating was immersed in pure water at ordinary temperature, and the time required for the pressure sensitive adhesive to be removed was measured. Judgments regarding water washability indicated in the table were based on the following criteria:

good: <10 min, fair: 10 to 30 min, and failure: >30 min.

Adhesive Strength

The pressure sensitive adhesive sheet obtained in each of the following Examples and Comparative Examples was applied to the back (polished by #2000) of a semiconductor wafer in 23° C./65% RH atmosphere by reciprocating a 2 kg rubber roller thereon, allowed to stand still for 20 min and peeled by means of a universal tensile tester (TENSILON/ UTM-4-100 manufactured by Orientec Corporation) at a peeling speed of 300 mm/min to thereby determine a 180° peeling adhesive strength (g/25 mm). Also, the pressure sensitive adhesive sheet was applied to and allowed to stand still under the same conditions, and, from the substrate film side, the pressure sensitive adhesive sheet was irradiated at a line speed of 5 m/min with ultraviolet rays emitted from a high pressure mercury lamp (80 W/cm) disposed at a distance of 10 cm from the pressure sensitive adhesive sheet. Thereafter, the 180° peeling adhesive strength was measured in the same manner.

Abbreviations employed in the Examples stand for the following matter:

1) Energy Beam Polymerizable Compounds

B1: reaction product (80% ethyl acetate solution) (weight average molecular weight: 2500) from 343.5 parts by weight of hexamethylene diisocyanate trimer (trade name: Coronate HX, produced by Nippon Polyurethane Co. Ltd.), 166.3 parts by weight of hydroxypropyl acrylate and 190.3 parts by weight of polyethylene glycol monomethyl ether.

B2: reaction product (80% ethyl acetate solution) (weight average molecular weight: 2000) from 52.8 parts by weight of hexamethylene diisocyanate, 10.7 parts by weight of pentaerythritol and 36.5 parts by weight of 2-hydroxyethyl acrylate.

B3: reaction product (40% toluene solution) (weight average molecular weight: 15,000) from 51.8 parts by weight of hydrogenated tolylene diisocyanate, 623.0 parts by weight of poly(butylene oxide)diol and 25.2 parts by weight of 2-hydroxyethyl acrylate.

2) Photopolymerization Initiator

C: 1-hydroxycyclohexyl phenyl ketone (trade name: Irgacure 184 produced by Ciba-Geigy).

Example 1

(Preparation of Pressure Sensitive Adhesive Composition)

(1) Production of Hydrophilic Pressure Sensitive Adhesive 3 parts by weight of acrylic acid, 90 parts by weight of 2-methoxyethyl acrylate, 7 parts by weight of 2-hydroxyethyl acrylate, 200 parts by weight of ethyl acetate and 0.5 part by weight of azobisisobutyronitrile were placed in a four-necked flask equipped with a reflux condenser, an agitator, a thermometer, an inert gas introducing tube and a dropping funnel. The mixture was agitated in a stream of nitrogen for 30 min and reacted at 60° C. for about 8 hr, thereby obtaining a carboxyl group containing copolymer.

Triethanolamine as a neutralizer was added in an amount of 1.25 parts by weight (0.2 mol per mol of carboxyl group) per 100 parts by weight, in terms of solid contents, of the above obtained carboxyl group containing copolymer and satisfactorily agitated.

Thereafter, an epoxy crosslinking agent (trade name: Tetrad C, produced by MITSUBISHI GAS CHEMICAL CO., INC.) as a crosslinking agent was added in an amount of 0.5 part by weight (0.03 mol per mol of carboxyl group) and satisfactorily agitated, thereby obtaining a hydrophilic pressure sensitive adhesive.

(2) Production of Energy Beam Curable Hydrophilic Pressure Sensitive Adhesive Composition 120 parts by weight of energy beam polymerizable compound B1 and 4.8 parts by weight of photopolymerization initiator C were added to 101.75 parts by weight of the above obtained hydrophilic pressure sensitive adhesive and satisfactorily blended, thereby obtaining an energy beam curable hydrophilic pressure sensitive adhesive composition.

(Production of Pressure Sensitive Adhesive Sheet)

A corona treated surface of a 110 μm thick polyethylene film was coated with the above obtained pressure sensitive adhesive composition so that the thickness of the coating having been dried was 20 μm. Thus, a pressure sensitive adhesive sheet with a total thickness of 130 μm was obtained.

The "residual particles", "water washability" and "adhesive strength" of the pressure sensitive adhesive sheet were evaluated by the above methods. The results are given in Table 2.

Example 2

(Preparation of Pressure Sensitive Adhesive Composition)

(1) Production of Hydrophilic Pressure Sensitive Adhesive

A hydrophilic pressure sensitive adhesive was obtained in the same manner as in Example 1 except that the amount of added neutralizer triethanolamine was changed to 1.75 parts by weight (0.3 mol per mol of carboxyl group).

(2) Production of Energy Beam Curable Hydrophilic Pressure Sensitive Adhesive Composition 120 parts by weight of energy beam polymerizable compound B2 and 4.8 parts by weight of photopolymerization initiator C were added per 102.25 parts by weight, in terms of solid contents, of the above obtained hydrophilic pressure sensitive adhesive and satisfactorily blended, thereby obtaining an energy beam curable hydrophilic pressure sensitive adhesive composition.

(Production of Pressure Sensitive Adhesive Sheet)

A pressure sensitive adhesive sheet was obtained in the same manner as in Example 1. The results are given in Table 2.

Example 3

(Preparation of Pressure Sensitive Adhesive Composition)

(1) Production of Hydrophilic Pressure Sensitive Adhesive

Polymerization was conducted in the same manner as in Example 1 except that the monomer mixture was changed to 10 parts by weight of acrylic acid, 5 parts by weight of 2-hydroxyethyl acrylate, 80 parts by weight of butyl acrylate and 5 parts by weight of methyl acrylate. 9 parts by weight (0.4 mol per mol of carboxyl group) of triethanolamine was added to the resulting polymer and satisfactorily agitated.

Thereafter, epoxy crosslinking agent (trade name: Tetrad C, produced by MITSUBISHI GAS CHEMICAL CO., INC.) as a crosslinking agent was added in an amount of 1 part by weight (0.02 mol per mol of carboxyl group) and satisfactorily agitated, thereby obtaining a hydrophilic pressure sensitive adhesive.

(2) Production of Energy Beam Curable Hydrophilic Pressure Sensitive Adhesive Composition 100 parts by weight of energy beam polymerizable compound B1 and 4 parts by weight of photopolymerization initiator C were added per 110.0 parts by weight, in terms of solid contents, of the above obtained hydrophilic pressure sensitive adhesive and satisfactorily blended, thereby obtaining an energy beam curable hydrophilic pressure sensitive adhesive composition.

(Production of Pressure Sensitive Adhesive Sheet)

A pressure sensitive adhesive sheet was obtained in the same manner as in Example 1. The results are given in Table 2.

Example 4
(Preparation of Pressure Sensitive Adhesive Composition)
(1) Production of Hydrophilic Pressure Sensitive Adhesive A hydrophilic pressure sensitive adhesive was obtained in the same manner as in Example 1.

(2) Production of Energy Beam Curable Hydrophilic Pressure Sensitive Adhesive Composition 120 parts by weight of energy beam polymerizable compound B3 and 4.8 parts by weight of photopolymerization initiator C were added per 102.25 parts by weight of the above obtained hydrophilic pressure sensitive adhesive and satisfactorily blended, thereby obtaining an energy beam curable hydrophilic pressure sensitive adhesive composition.

(Production of Pressure Sensitive Adhesive Sheet)

A pressure sensitive adhesive sheet was obtained in the same manner as in Example 1. The results are given in Table 2.

Comparative Example 1
(Preparation of Pressure Sensitive Adhesive Composition)
(1) Production of Pressure Sensitive Adhesive 5 parts by weight of 2-hydroxyethyl acrylate and 95 parts by weight of butyl acrylate were polymerized. 0.2 part by weight of isocyanate crosslinking agent (trade name: Coronate L, produced by Nippon Polyurethane Co. Ltd.) as a crosslinking agent was added thereto and satisfactorily agitated. Thus, a pressure sensitive adhesive was obtained.

(2) Production of Energy Beam Curable Pressure Sensitive Adhesive Composition 100 parts by weight of energy beam polymerizable compound B1 and 4 parts by weight of photopolymerization initiator C were added per 100.2 parts by weight, in terms of solid contents, of the above obtained pressure sensitive adhesive and satisfactorily blended, thereby obtaining an energy beam curable pressure sensitive adhesive composition.

(Production of Pressure Sensitive Adhesive Sheet)

A pressure sensitive adhesive sheet was obtained in the same manner as in Example 1. The results are given in Table 2.

Comparative Example 2

The same procedure as in Example 1 was repeated except that the neutralizer triethanolamine was not used and that the amount of added energy beam polymerizable compound B1 was changed to 100 parts by weight. The results are given in Table 2.

TABLE 1

|  | Pressure sensitive adhesive (pts. wt) | Energy beam polymerizable compd. (pts. wt) | | | Photopolymn initiator (pts. wt) |
| --- | --- | --- | --- | --- | --- |
|  |  | B1 | B2 | B3 |  |
| Ex. 1 | 101.75 | 120 | — | — | 4.8 |
| Ex. 2 | 102.25 | — | 120 | — | 4.8 |
| Ex. 3 | 110.0 | 100 | — | — | 4 |
| Ex. 4 | 102.25 | — | — | 120 | 4.8 |
| Comp. Ex. 1 | 100.2 | 100 | — | — | 4 |
| Comp. Ex. 2 | 100.2 | 100 | — | — | 4 |

The pressure sensitive adhesives of the Examples are hydrophilic while those of the Comparative Examples are hydrophobic.

TABLE 2

|  | No. of residual particles (no./4" wafer) >0.27 μm | Water washability | | Adhesive strength before UV irradiation (g/25 mm) to SUS, JIS | Adhesive strength after UV irradiation (g/25 mm) to SUS, JIS |
| --- | --- | --- | --- | --- | --- |
|  |  | time required for removal | judgment |  |  |
| Ex. 1 | 18 | 2 min | good | 350 | 15 |
| Ex. 2 | 12 | 9 min | good | 400 | 5 |
| Ex. 3 | 23 | 27 min | fair | 380 | 20 |
| Ex. 4 | 30 | 12 min | fair | 450 | 25 |
| Comp. Ex. 1 | 27 | >2 hrs | fail | 320 | 10 |
| Comp. Ex. 2 | 17 | >2 hrs | fail | 340 | 15 |

What is claimed is:

1. An energy beam curable hydrophilic pressure sensitive adhesive composition comprising a hydrophilic pressure sensitive adhesive (A) and an energy beam polymerizable compound (B),
   wherein the hydrophilic pressure sensitive adhesive (A) is composed of a pressure sensitive adhesive composition formed from:
   a carboxyl group containing copolymer obtained by polymerizing a first polymerizable monomer (A1) containing a carboxyl group and a second monomer (A2) that is copolymerizable with the first polymerizable monomer (A1) containing the carboxyl group according to solution polymerization,
   a neutralizer (A3), and
   a crosslinking agent (A4).

2. The energy beam curable hydrophilic pressure sensitive adhesive composition as claimed in claim 1, wherein the second monomer (A2) that is copolymerizable with the carboxyl group containing polymerizable monomer is a compound represented by the formula:

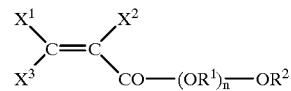

wherein each of $X^1$, $X^2$ and $X^3$ independently represents hydrogen or a methyl group; $R^1$ represents a divalent hydrocarbon group having 2 to 12 carbon atoms; $R^2$ represents a hydrocarbon group having 1 to 10 carbon atoms; and n is 1 to 10.

3. The energy beam curable hydrophilic pressure sensitive adhesive composition as claimed in claim 1, which further comprises a photopolymerization initiator (C).

4. The energy beam curable hydrophilic pressure sensitive adhesive composition as claimed in claim 2, which further comprises a photopolymerization initiator (C).

5. A pressure sensitive adhesive sheet comprising a substrate coated with the energy beam curable hydrophilic pressure sensitive adhesive composition as claimed in claim 1.

6. A pressure sensitive adhesive sheet comprising a substrate coated with the energy beam curable hydrophilic pressure sensitive adhesive composition as claimed in claim 2.

7. A pressure sensitive adhesive sheet comprising a substrate coated with the energy beam curable hydrophilic pressure sensitive adhesive composition as claimed in claim 3.

8. A pressure sensitive adhesive sheet comprising a substrate coated with the energy beam curable hydrophilic pressure sensitive adhesive composition as claimed in claim 4.

* * * * *

UNITED STATES PATENT AND TRADEMARK OFFICE
CERTIFICATE OF CORRECTION

PATENT NO. : 6,040,048
DATED : March 21, 2000
INVENTOR(S) : Kiichiro Kato et al.

It is certified that error appears in the above-identified patent and that said Letters Patent is hereby corrected as shown below:

Title Page, References Cited, FOREIGN PATENT DOCUMENTS, delete third reference "0252739".

Title page, References Cited, FOREIGN PATENT DOCUMENTS, delete reference 10, "0687260".

Column 1 Line 45 after "swellable" insert comma (,).

Column 1 Line 51 delete "one" and insert --type,--.

Column 1 Line 66 after "at the time of peeling" insert --would--.

Column 1 Line 66 "in demanded" should read --in demand--.

Column 3 Line 8 after "back" insert comma (,).

Column 9 Line 41 "purpose" should read --purposes--.

Column 12 Line 15 "from the water" should read --from the wafer--.

Column 12 Line 21 "from the water" should read --from the wafer--.

UNITED STATES PATENT AND TRADEMARK OFFICE
CERTIFICATE OF CORRECTION

PATENT NO. : 6,040,048
DATED : March 21, 2000
INVENTOR(S) : Kiichiro Kato et al.

It is certified that error appears in the above-identified patent and that said Letters Patent is hereby corrected as shown below:

Column 13 Line 11 after "adhesive" delete "only".

Signed and Sealed this

Twenty-fourth Day of April, 2001

Attest:

NICHOLAS P. GODICI

Attesting Officer

Acting Director of the United States Patent and Trademark Office